(12) United States Patent  
Anzalone et al.

(10) Patent No.: US 11,309,177 B2
(45) Date of Patent: Apr. 19, 2022

(54) APPARATUS AND METHOD FOR MANUFACTURING A WAFER

(71) Applicant: STMICROELECTRONICS S.r.l., Agrate Brianza (IT)

(72) Inventors: Ruggero Anzalone, Viagrande (IT); Nicolo' Frazzetto, San Giovanni la Punta (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 524 days.

(21) Appl. No.: 16/182,050

(22) Filed: Nov. 6, 2018

(65) Prior Publication Data
US 2020/0144047 A1 May 7, 2020

(51) Int. Cl.
| | |
|---|---|
| *H01L 21/02* | (2006.01) |
| *H01L 29/16* | (2006.01) |
| *H01L 21/683* | (2006.01) |
| *C23C 16/01* | (2006.01) |
| *C23C 16/32* | (2006.01) |

(52) U.S. Cl.
CPC ........ *H01L 21/02008* (2013.01); *C23C 16/01* (2013.01); *C23C 16/325* (2013.01); *H01L 21/0262* (2013.01); *H01L 21/02381* (2013.01); *H01L 21/02529* (2013.01); *H01L 21/6835* (2013.01); *H01L 29/1608* (2013.01); *H01L 2221/68345* (2013.01); *H01L 2221/68381* (2013.01)

(58) Field of Classification Search
CPC ......... H01L 21/02008; H01L 21/02381; H01L 21/68735; H01L 21/6878; H01L 21/02378; H01L 21/02529; H01L 21/6835; H01L 21/0262; H01L 29/1608; C23C 16/4581; C23C 16/325; C23C 16/4585; C23C 16/46; C23C 16/01
See application file for complete search history.

(56) References Cited

U.S. PATENT DOCUMENTS

| | | | | |
|---|---|---|---|---|
| 3,108,818 | A * | 10/1963 | Furstenburg | F16J 15/061 277/637 |
| 3,922,712 | A * | 11/1975 | Stryker | H01L 23/3121 257/737 |
| 5,923,408 | A * | 7/1999 | Takabayashi | G03F 7/707 355/53 |
| 6,367,803 | B1 * | 4/2002 | Loth | F16L 23/18 277/321 |
| 7,736,528 | B2 * | 6/2010 | Okita | H01L 21/3065 216/58 |
| 9,406,504 | B2 * | 8/2016 | Frisina | C30B 29/36 |
| 10,475,673 | B2 * | 11/2019 | Anzalone | H01L 21/68757 |
| 2008/0069951 | A1 | 3/2008 | Chacin et al. | |
| 2009/0255901 | A1 | 10/2009 | Okita et al. | |
| 2013/0157448 | A1 | 6/2013 | Frisina et al. | |

(Continued)

*Primary Examiner* — Nahida Sultana
(74) *Attorney, Agent, or Firm* — Seed IP Law Group LLP

(57) ABSTRACT

Various embodiments provide an apparatus and method for fabricating a wafer, such as a SiC wafer. The apparatus includes a support having a plurality of arms for supporting a substrate. The arms allows for physical contact between the support and the substrate to be minimized. As a result, when the substrate is melted, surface tension between the arms and molten material is reduced, and the molten material will be less likely to cling to the support.

17 Claims, 5 Drawing Sheets

(56) References Cited

U.S. PATENT DOCUMENTS

| | | | |
|---|---|---|---|
| 2017/0045828 A1* | 2/2017 | Van Sommeren | G03F 7/70866 |
| 2018/0090350 A1 | 3/2018 | Anzalone et al. | |
| 2019/0080951 A1* | 3/2019 | Huston | H01L 21/68757 |
| 2020/0144047 A1 | 5/2020 | Anzalone et al. | |
| 2020/0234996 A1* | 7/2020 | Rokkam | H01L 21/68785 |
| 2021/0233798 A1* | 7/2021 | Alaniz | H01L 21/68728 |
| 2021/0263418 A1* | 8/2021 | Scholten | H01L 21/6875 |

\* cited by examiner

ABSTRACT AND METHOD FOR
MANUFACTURING A WAFER

BACKGROUND

Technical Field

The present disclosure is directed to an apparatus and method for fabricating semiconductor wafers.

Description of the Related Art

Semiconductor devices are typically fabricated in silicon wafers. However, silicon carbide (SiC) wafers have become increasing popular due, at least in part, to the chemical-physical properties of SiC. For example, SiC generally has a higher band gap than silicon. As a result, SiC, even at relatively small thicknesses, has a higher breaking voltage compared to silicon. Accordingly, SiC is desirable for applications that have high voltages, such as power applications.

SiC may occur in a number of different chrystallographic structures or polytypes. The most common polytypes are the cubic polytype (3C polytype), the hexagonal polytype (4H and 6H polytypes), and the rhombohedric polytype (15R polytype). 3C SiC wafers possess unique properties in comparison other wafer polytypes. For example, 3C SiC wafers generally have lower density of traps and/or higher channel electron mobility than 4H SiC wafers.

BRIEF SUMMARY

The present disclosure is directed to an apparatus and method for fabricating a semiconductor wafer, such as a silicon carbide (SiC) wafer.

According to one embodiment, the apparatus includes a body, a heater, an input duct, an output duct, a support, and a receptacle. The support is positioned on the receptacle and in the reaction chamber. The support includes a plurality of arms for supporting a substrate or a wafer, such as a silicon substrate. The arms allows for physical contact between the support and the substrate to be minimized. As a result, when the substrate is melted, surface tension between the arms and molten material is reduced, and the molten material will be less likely to cling to the support, itself.

According to one embodiment, a method is used to fabricate a SiC wafer. The method includes positioning a silicon substrate on the support, and forming a first layer of silicon carbide on the silicon substrate by exposing the silicon substrate to a flow of precursors (i.e., hetero-epitaxy). The silicon substrate has a first melting temperature and the silicon carbide has a second melting temperature that is higher than the first melting temperature. The method further includes heating the reaction chamber to a temperature that is higher than the first melting temperature and lower than the second melting temperature such that the silicon substrate begins to melt. The melted silicon substrate drains through an opening in the support and into the receptacle. The temperature of the reaction chamber is maintained until the first layer of silicon carbide is substantially separated from the silicon substrate. Simultaneously with or subsequent to the melting of the silicon substrate, the first layer of silicon carbide is exposed to a flow of precursors to form a second layer of silicon carbide (i.e., homo-epitaxy). Once the second layer of silicon carbide reaches a desired thickness, any remaining portions of the silicon substrate coupled to the first layer of silicon carbide is removed by an etching process.

DETAILED DESCRIPTION

Figure 1:
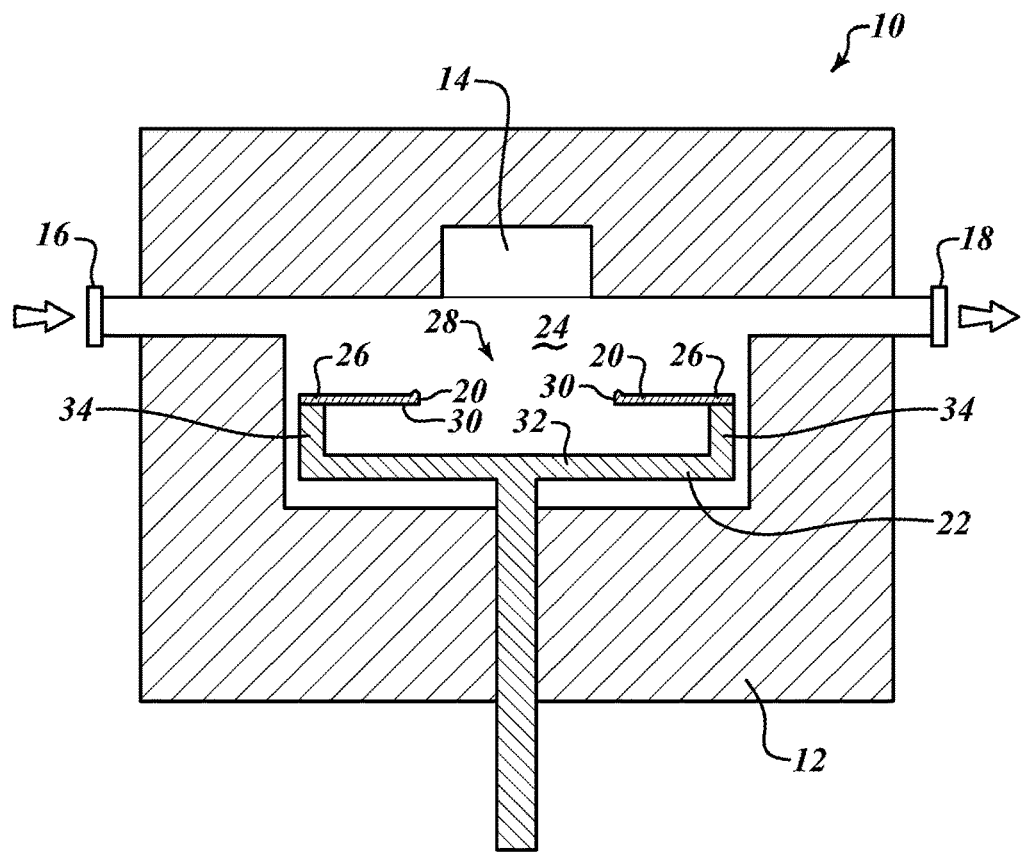
FIG. 1 is a cross-sectional view of an apparatus according to an embodiment of the present disclosure.

In the following description, certain specific details are set forth in order to provide a thorough understanding of various embodiments of the disclosure. However, one skilled in the art will understand that the disclosure may be practiced without these specific details. In some instances, well-known details associated with, for example, reaction chambers, fabrication processes, and/or semiconductor wafers have not been described to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

One solution for fabricating a silicon carbide (SiC) wafer is disclosed in U.S. patent application Ser. No. 15/715,940, entitled "APPARATUS FOR MANUFACTURING A SILICON CARBIDE WAFER". The fabrication of the SiC wafer disclosed in U.S. patent application Ser. No. 15/715,940 includes, for example, placing a silicon substrate on a support having a plurality of bars and openings, growing a 3C-SiC epitaxial layer on the silicon substrate, and then separating the silicon substrate from the 3C-SiC epitaxial layer by melting the silicon substrate. The melted silicon is drained through the plurality of openings in the support and into a receptacle. The inventors have since discovered that the support disclosed in U.S. patent application Ser. No. 15/715,940 may not always properly drain the melted silicon into the receptacle. Rather, the inventors have discovered that the melted silicon may sometimes stick or cling to the support, itself, due to surface tension between the melted silicon and the support.

An improved apparatus and method for fabricating a wafer, such as a SiC wafer, are described herein. The apparatus may address one or more of the problems associated with the fabrication of a SiC wafer as described in U.S. patent application Ser. No. 15/715,940.

FIG. 1 is a cross-sectional view of an apparatus 10 according to one embodiment. The apparatus 10 includes a body 12, a heater 14, an input duct 16, an output duct 18, a support 20, and a receptacle 22.

The body 12 forms a reaction chamber 24. The reaction chamber 24 provides an enclosed space for various reactions to occur. The support 20 and the receptacle 22 are positioned within the reaction chamber 24. In one embodiment, the body 12 is made of an insulating material that thermally insulates the reaction chamber 24 from an external environment.

The heater 14 is coupled to the body 12. The heater 14 heats the reaction chamber 24 and any contents within the reaction chamber 24 (e.g., the support 20, the receptacle 22, gases, substrates, wafers, or other various objects). The heating device 14 may be any type of heating device. For example, the heater 14 may be an inductive heater including, for example, a plurality of coils; a resistive heater including, for example, carbide covered resistors; etc.

The input duct 16 provides a fluidic path from an environment external to the apparatus 10 and into the reaction chamber 24. In one embodiment, as will be discussed in further detail below with respect to FIGS. 9 to 13, the input duct 16 is used to input precursors and gases into the reaction chamber 24.

The output duct 18 provides a fluidic path from the reaction chamber 24 and out to an environment external to the reaction chamber 24. In one embodiment, as will be discussed in further detail below with respect to FIGS. 9 to 13, the output duct 18 is used to discharge reaction gases from the reaction chamber 24.

In one embodiment, the apparatus 10 is a horizontal flux reaction chamber. In this embodiment, as shown in FIG. 1, the input duct 16 and the output duct 18 are horizontally aligned with each other, and gases flow longitudinally along, for example, an upper surface of the support 20. Other configurations are also possible. For example, in one embodiment, the apparatus 10 is a vertical flux reaction chamber. In this embodiment, the input duct 16 and an output duct 18 are vertically aligned with each other, and gases flow transverse to, for example, an upper surface of the support 20.

The support 20 is positioned on the receptacle 22 and in the reaction chamber 24. The support 20 provides a platform to receive and hold various objects, such as a substrate or a wafer, within the reaction chamber 24. For example, as will be discussed in further detail below with respect to FIGS. 9 to 13, a silicon substrate is positioned on the support 20 during fabrication of a SiC wafer. The support 20 is often referred to as a susceptor.

As will be discussed in further detail below with respect to FIGS. 2 to 8, the support 20 includes a frame 26 positioned on and supported by the receptacle 22; an opening 28 that provides a drain in which material may flow through; and a plurality of arms 30 to support, for example, a silicon substrate.

The receptacle 22 is positioned in the reaction chamber 24 and directly underlies the support 20. The support 20 rests upon the receptacle 22. The receptacle 22 collects any material that is drained through the opening 28 of the support 20. The receptacle 22 includes a base 32 and sidewalls 34. The base 32 directly underlies the opening 28 and the arms 30 of the support 20. The sidewalls 34 directly underlie the frame 26 of the support 20. In one embodiment, the sidewalls 34 are in direct physical contact with the frame 26 of the support 20.

Figure 2:
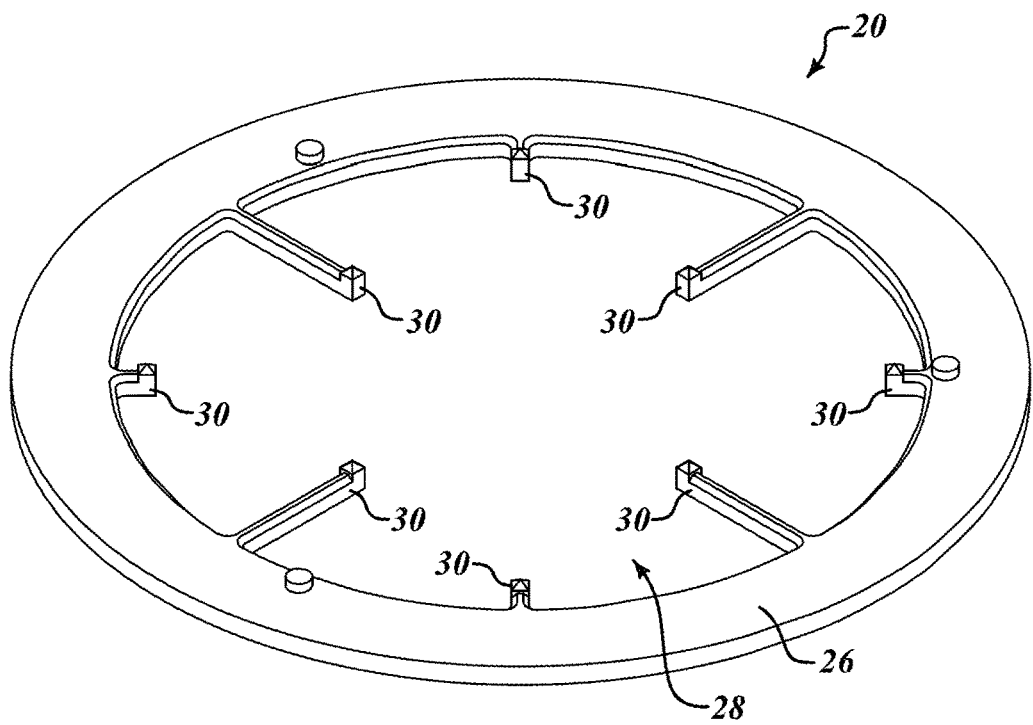
FIG. 2 is a perspective view of a support according to an embodiment of the present disclosure.
Figure 3:
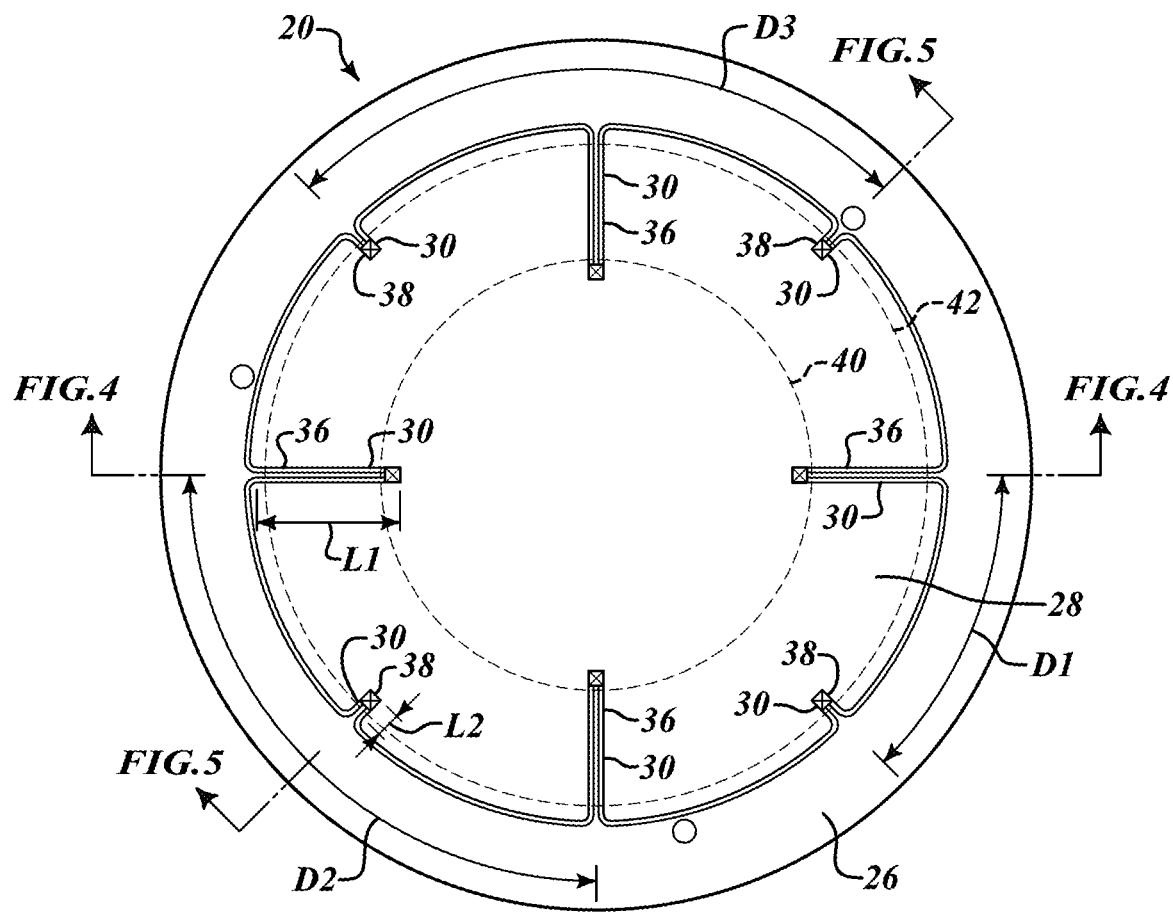
FIG. 3 is a plan view of the support of FIG. 2.
Figure 4:
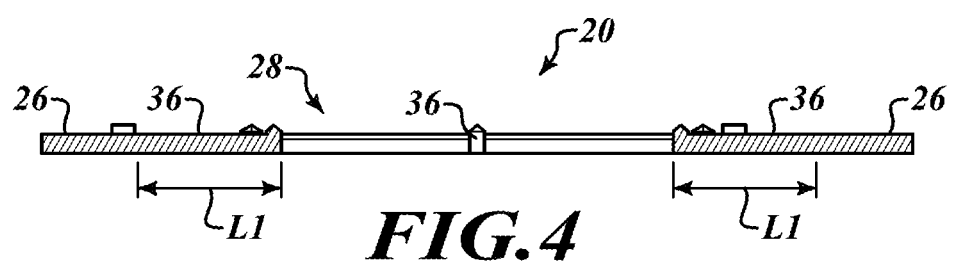
FIG. 4 is a cross-sectional view of the support along the axis shown in FIG. 3.
Figure 5:
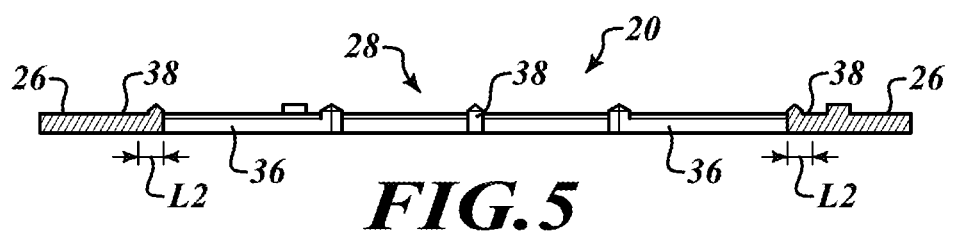
FIG. 5 is a cross-sectional view of the support along the axis shown in FIG. 3.

FIG. 2 is a perspective view of the support 20 according to an embodiment of the present disclosure. FIG. 3 is a plan view of the support 20 according to an embodiment of the present disclosure. FIG. 4 is a cross-sectional view of the support 20 along the axis shown in FIG. 3 according to an embodiment of the present disclosure. FIG. 5 is a cross-sectional view of the support 20 along the axis shown in FIG. 3 according to an embodiment of the present disclosure. It is beneficial to review FIGS. 2 to 5 together. The support 20 includes the frame 26, the opening 28, and the arms 30.

The frame 26 physically couples the plurality of arms 30 together. As previously discussed with respect to FIG. 1, the frame 26 rests upon the sidewalls 34 of the receptacle 22. The frame 26 may have any shape. For example, the frame 26 may be circular or rectangular in shape. In one embodiment, as best shown in FIG. 3, the support 20 has a circular shape.

The opening 28 is formed in the frame 26. Stated differently, the opening 28 is surrounded and enclosed by the frame 26. The opening 28 provides a drain through which material may flow. For example, as will be discuss in further detail below with respect to FIGS. 9 to 13, a silicon substrate is positioned on the support 20 and is melted and drained through the opening 28.

The arms 30 are physically coupled to each other by the frame 26, and are cantilevered from the frame 26. In particular, as best shown in FIGS. 1 and 2, each of the plurality of arms has a fixed end attached to the frame 26; and a free end, which is opposite to the fixed end, that is suspended over the receptacle 22. In one embodiment, as best shown in FIGS. 2 to 3, the arms 30 extend from the frame 26 towards a center of the opening 28. The arms 30 are used to support a substrate or a wafer within the reaction chamber 24. For example, as will be discussed in further detail below, a silicon substrate is positioned on the support 20 to fabricate a SiC wafer.

In one embodiment, all of the arms 30 may also have the same length. In another embodiment, the arms 30 have varying lengths. For example, in one embodiment, the arms 30 include multiple sets of arms with each set of arms having a different length. For example, as best shown in FIGS. 2 and 3, the arms 30 include two sets of arms: a first set of arms 36 having a first length L1, and a second set of arms 38 having a second length L2 that is smaller than the first length L1. By having multiple sets of arms with different lengths, the support 20 is able to support different sized wafers. For example, referring to FIG. 3, the first set of arms 36 is configured to support a first circular substrate having an outline 40 with a first radius, and the second set of arms 38 is configured to support a second circular substrate having an outline 42 with a second radius that is larger than the first radius.

In one embodiment, all of the arms 30 are positioned within the same plane. For example, as shown in FIGS. 3 to 5, the first set of arms 36 and the second set of arms 38 are positioned within the same plane. In another embodiment, the arms 30 may have arms positioned in different parallel planes. For example, in one embodiment, the first set of arms 36 are positioned in a first plane, and the second set of arms 38 are positioned in a second plane that is above and parallel to the first plane. Stated differently, the second set of arms 38 are positioned above the first set of arms 36. Having arms positioned in different planes minimizes the number of arms that contact a substrate positioned on the support 20. For example, if the second circular substrate having the outline 42 is positioned on the second set of arms 38, the second circular substrate would not contact the first set of arms 36 as the first set of arms 36 are positioned below the second set of arms 38.

In one embodiment, the arms of the multiple sets of arms are positioned in an alternating fashion. For example, as best shown in FIGS. 2 and 3, the first set of arms 36 are alternated with the second set of arms 38 around the frame 26.

Although the first set of arms 36 and the second set of arms 38 each include four arms, each of the multiple sets of arms may include any number of arms. For example, the first set of arms 36 may include 3, 5, 6 or 8 arms.

In one embodiment, the arms 30 are spaced from each other. For example, as best shown in FIGS. 2 to 3, the arms 30 are spaced from each other by the opening 28. Having the arms 30 spaced from each other ensures that the arms 30 do not block or impede material that is drained through the opening 28.

In one embodiment, the arms 30 are spaced from each other by substantially equal distances along the frame 26. For example, referring to FIG. 3, the arms 30 are separated by each other by a distance D1 along the frame 26.

As previously discussed, in one embodiment, the arms 30 include multiple sets of arms with each set of arms having a different length. In one embodiment, the arms of each set of arms are spaced from each other by substantially equal distances along the frame 26. For example, referring to FIG. 3, the first set of arms 36 may be separated from each other by a second distance D2. Similarly, the second set of arms 38 may be separated from each other by a third distance D3. In one embodiment, the second distance D2 and the third distance D3 are substantially equal to each other.

As previously discussed, the support disclosed in U.S. patent application Ser. No. 15/715,940 may not always properly drain the melted silicon into the receptacle. Rather, the inventors have discovered that the melted silicon may sometimes stick or cling to the support, itself, due to surface tension between the melted silicon and the support. To address this problem, in one or more embodiments, the arms 30 are configured to minimize physical contact between the arms 30 and the substrate (e.g., a silicon substrate) placed on the arms 30. By minimizing physical contact between the arms 30 and the substrate placed on the arms 30, when the substrate is melted, surface tension between the arms 30 and molten material (e.g., melted silicon) is reduced. As a result, the molten material will be less likely to stick or cling to the arms 30 and will instead flow off of the arms 30 and in to the receptacle 22.

Figure 6:
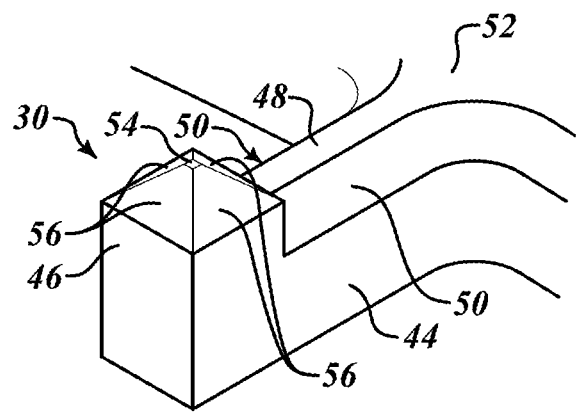
FIG. 6 is an enlarged perspective view of an arm of the support of FIG. 2.
Figure 7:
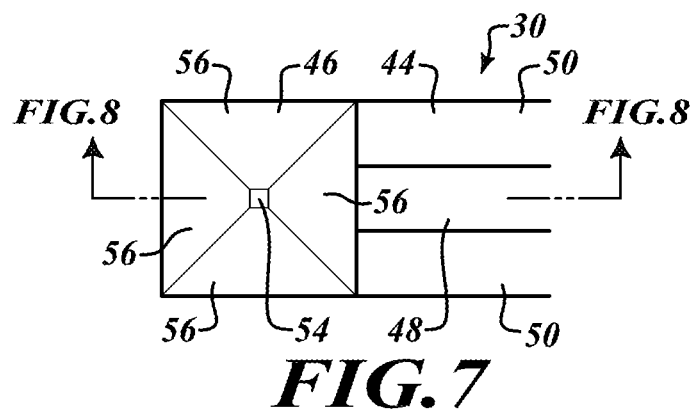
FIG. 7 is an enlarged plan view of the arm of FIG. 6.
Figure 8:
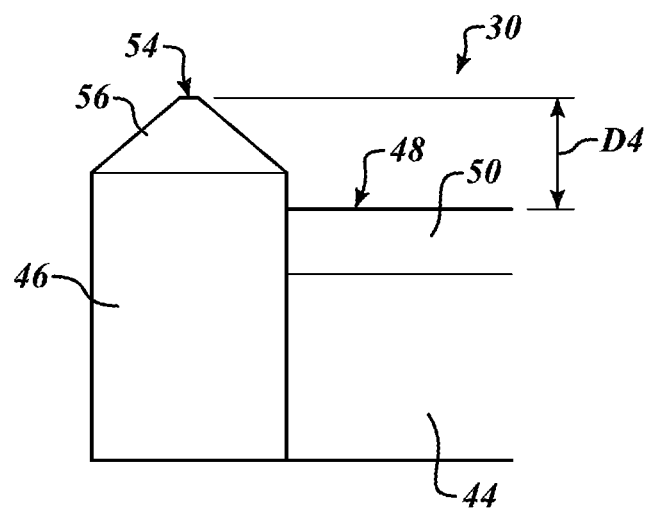
FIG. 8 is an enlarged cross-sectional view of the arm along the axis shown in FIG. 7.

FIG. 6 is an enlarged perspective view of the arm 30 of the support 20 according to an embodiment of the present disclosure. FIG. 7 is an enlarged plan view of the arm 30, and FIG. 8 is an enlarged cross-sectional view of the arm 30 along the axis shown in FIG. 7. It is beneficial to review FIGS. 6 to 8 together. The arm 30 includes a body portion 44 and a raised portion 46.

The body portion 44 includes a first end physically coupled to the frame 26, and a second end physically coupled to the raised portion 46. In one embodiment, as best shown in FIGS. 2 to 3, the arms 30 extend from the frame 26 towards a center of the opening 28. The body portion 44 is used to position the raised portion 46 away from the frame 26. This ensures that when a substrate is positioned on the raised portion 46 and then melted, the melted material will not flow on to the frame 26, and will instead flow in to the receptacle 22. The body portion 44 includes an upper surface 48 and side surfaces 50.

The upper surface 48 of the body portion 44 is a planar surface. In one embodiment, the upper surface 48 is substantially coplanar with an upper surface 52 of the frame 26.

The side surfaces 50 of the body portion 44 are slanted or tilted surfaces. The side surfaces 50 are slanted or tiled downward so that melted material may readily slide off of the body portion 33, through the opening 28, and in to the receptacle 22.

The raised portion 46 is physically coupled to the body portion 44. The raised portion 46 is used to support a substrate within the reaction chamber 24. The raised portion 46 includes an upper surface 54 and side surfaces 56.

The upper surface 54 of the raised portion 46 provides a planar surface for substrates to rest upon. For example, as will be discussed in further detail below with respect to FIG. 9, a silicon substrate is positioned on the upper surface 54 during fabrication of a SiC wafer. In one embodiment, the upper surface 54 of the raised portion 46 and the upper surface 48 of the body portion 44 are substantially parallel to each other.

The upper surface 54 allows physical contact between the support 20 and a substrate (e.g., a silicon substrate) placed on the support 20, specifically the arms 30, to be minimized. Namely, when a substrate is placed on the upper surface 54, the substrate will physically contact the upper surface 54 but will not physically contact the remaining portions of the support 20 (e.g., the frame 26, the body portion 44 of the arms 30, and the side surfaces 56 of the raised portion 46, etc.). Thus, when the substrate is melted, surface tension between the support 20 and molten material (e.g., melted silicon) is reduced. As a result, the molten material is less likely to stick or cling to the arms 30 and will instead flow off of the arms 30 and in to the receptacle 22.

The side surfaces 56 of the raised portion 46, similar to the side surfaces 50 of the body portion 44, are slanted or tilted downward so that melted material may readily slide off of the raised portion 46, through the opening 28, and in to the receptacle 22. The raised portion 46 may include any number of side surfaces 56 (e.g., one, three, four, five side surfaces). For example, in the embodiment shown in FIGS. 6 to 8, the raised portion 46 is pyramid-shaped with four side surfaces 56 and the upper surface 54 at the apex of the pyramid. As another example, the raised portion 46 may be cone-shaped with a single side surface 56 and the upper surface 54 at the apex of the cone.

The raised portion 46 lifts or raises the substrate placed on its upper surface 54 to be above the body portion 44 and/or the frame 26. For example, as shown in FIG. 8, the upper surface 54 is raised above the upper surface 48 of the body portion 44 by a distance D4. In one embodiment, the distance D4 is between 0.5 to 3 millimeters. As will be discussed in further detail with respect to FIG. 13, raising the substrate positioned on the raised portion 46, specifically the upper surface 54 of the raised portion 46, allows an etching gas to flow and contact a lower surface of the substrate.

The support 20 may be made from a wide variety of materials. For example, the support 20 may be made of graphite, iron, copper, aluminium, nickel etc. In one embodiment, the support 20 is made of a material having a high melting temperature such that the support 20 does not melt when the heater 14 is on. In one embodiment, the support 20 has a melting temperature that is greater than a melting temperature of a substrate intended to be melted in the reaction chamber 24.

In one embodiment, the support 20, including the frame 26 and the arms 30, are a single contiguous piece. For example, the support 20 may be formed from a single piece of material.

The support 20 may be fabricated using various fabrication techniques. For example, the support 20 may be fabricated by stamping a flat sheet of material using a forming press.

FIGS. 9 to 13 are cross-sectional views illustrating various stages of a method of fabricating a wafer using the apparatus of FIG. 1 according to an embodiment disclosed herein. In the embodiments shown in FIGS. 9 to 13, a SiC wafer, such as a 3C SiC wafer, is fabricated. It is noted that the body 12, the heater 14, the input duct 16, and the output duct 18 are not shown in FIGS. 9 to 13 for simplicity purposes.

Figure 9:
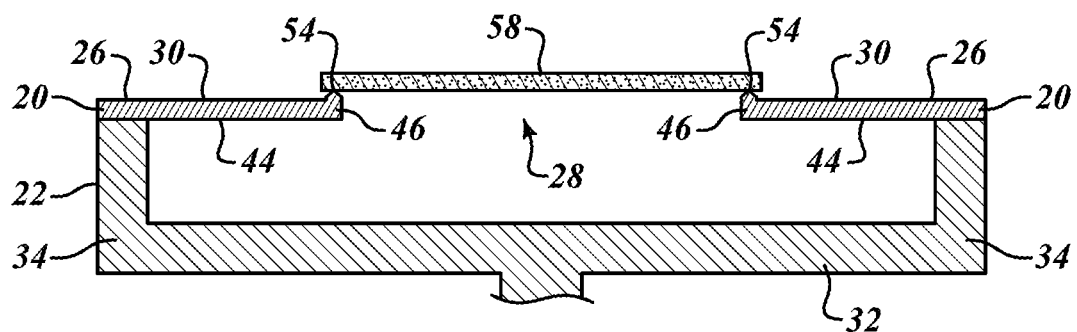
FIGS. 9 to 13 are cross-sectional views illustrating various stages of a method of fabricating a wafer using the apparatus of FIG. 1 according to an embodiment disclosed herein.

As shown in FIG. 9, a substrate of a first material is positioned on the support 20 and in the reaction chamber 24. In the embodiment shown in FIG. 9, a silicon substrate 58 is positioned on the support 20 and in the reaction chamber 24. The silicon substrate 58 is positioned on the upper surfaces 54 of the raised portion 46 of the arms 30. In one embodiment, the silicon substrate 58 has a crystalline structure. In one embodiment, the reaction chamber 24 is at room temperature when the silicon substrate 58 is positioned on the support 20.

Once the silicon substrate 58 is positioned on the support 20, the reaction chamber 24 is sealed and heated by the heater 14 to a first temperature. In one embodiment, the first temperature is between 450 and 550 degrees Celsius. The reaction chamber 24 is also set to have a first pressure level. In one embodiment, the first pressure level is between 8E-5 and 12E-5 bar.

Subsequent to the reaction chamber 24 being heated to the first temperature, the reaction chamber 24 is heated by the heater 14 to a second temperature that is greater than the first temperature. In one embodiment, the second temperature is between 1050 to 1150 degrees Celsius. The reaction chamber 24 is also set to have a second pressure level that is greater than the first pressure level. In one embodiment, the second pressure level is between 75-125 mbar.

The reaction chamber 24 is maintained at the second pressure level for the remainder of the process.

Subsequent to the reaction chamber 24 being heated to the second temperature, the silicon substrate 58 is immersed in hydrogen ($H_2$). The $H_2$ is introduced into reaction chamber 24 through the input duct 16. In addition, the silicon substrate 58 is subjected to activation operations by introducing hydrogen chloride (HCl) into the reaction chamber 24 through the input duct 16.

The reaction chamber 10 is then heated by the heater 14 to a third temperature that is greater than the second temperature. In one embodiment, the third temperature is between 1340 and 1400 degrees Celsius.

While or subsequent to the reaction chamber 24 being heated to the third temperature, a carbon precursor is introduced into the reaction chamber 24 through the input duct 16. The carbon precursor carbonizes the superficial silicon atoms of the silicon substrate 26 to form a thin layer (e.g., in the order of a few nanometers) of SiC, such as 3C SiC. This is often referred to as ramp carbonization. As will be discussed below, the thin layer of SiC acts as a seed for SiC growth.

Figure 10:
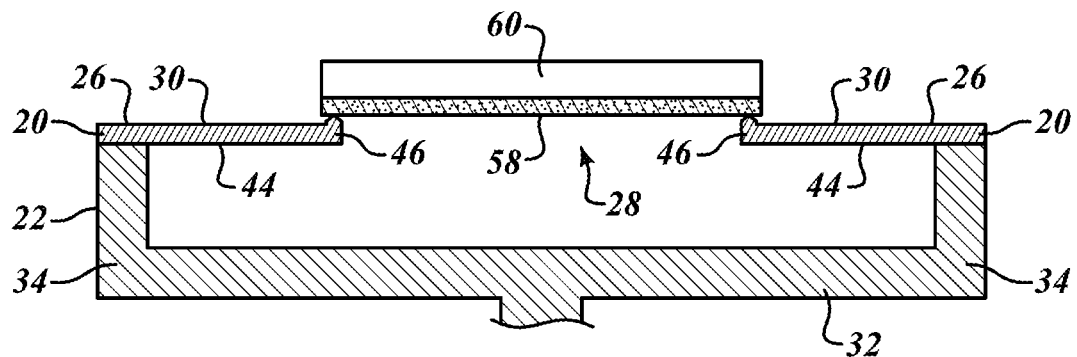

Once the reaction chamber 24 is at the third temperature, a silicon precursor is added to the carbon precursor in the reaction chamber 24. By introducing the silicon precursor into the reaction chamber 24, a layer of a second material begins to grow. In particular, a first SiC layer 60 begins to epitaxially grow from the thin layer of SiC as shown in FIG. 10. This is often referred to as hetero-epitaxial growth.

Figure 11:
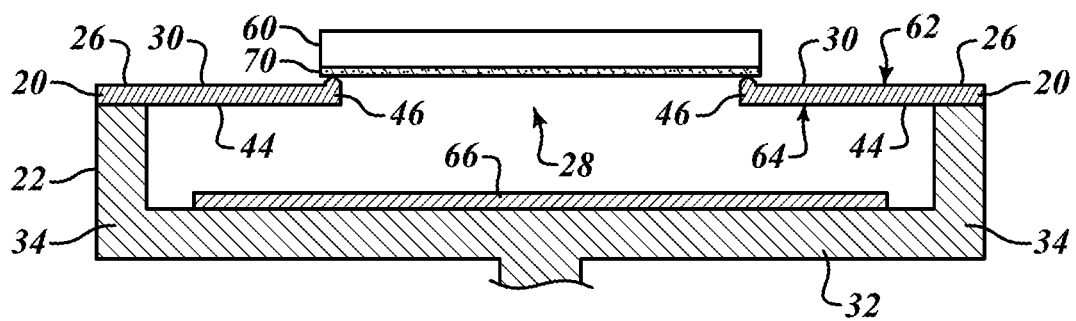

While maintaining a flow of $H_2$ into the reaction chamber 24 through the input duct 16, a melting process is performed. In particular, the reaction chamber 24 is heated by the heater 14 to a fourth temperature. The fourth temperature is greater than a melting temperature of the silicon substrate 58 and less than a melting temperature of the first SiC layer 60. In one embodiment, the fourth temperature is between 1550 to 1650 degrees Celsius. As a result, as shown in FIG. 11, the silicon substrate 58 melts and drains into the receptacle 22. That is, melted silicon material 66 of the silicon substrate 58 flows from an upper side 62 of the support 20, through the opening 28, and to a lower side 64 of the support 20. The melted silicon material 66 of the silicon substrate 58 is collected in the receptacle 22.

As previously discussed, the upper surface 54 allows physical contact between the support 20 and a substrate placed on the support 20 to be minimized. In this case, as the silicon substrate 58 is placed upon the upper surface 54 of the raised portion 46 of the arms 30, the silicon substrate 58 will physically contact the upper surface 54 but will not physically contact the remaining portions of the support 20 (e.g., the frame 26, the body portion 44 of the arms 30, and the side surfaces 56 of the raised portion 46, etc.). Thus, when the silicon substrate 58 is melted, surface tension between the support 20 and the melted silicon material 66 is reduced. As a result, the melted silicon material 66 is less likely to stick or cling to the arms 30 and will instead flow off of the arms 30 and in to the receptacle 22.

Further, as previously discussed, the body portion 44 and the raised portions 46 of the arms 30 have side surfaces 50 and side surfaces 56, respectively, that are slanted or tilted downward. As a result, the melted silicon material 66 may easily slide off of the arms 30, through the opening 28, and in to the receptacle 22.

In one embodiment, the fourth temperature of the reaction chamber 24 is maintained until all of the silicon substrate 58 is removed from the first SiC layer 60.

In one embodiment, the fourth temperature of the reaction chamber 24 is maintained until the silicon substrate 58 is substantially melted and separated from the first SiC layer 60. For example, as shown in FIG. 11, the fourth temperature of the reaction chamber 24 may be maintained until small residual portions 70 (e.g., a thin layer of silicon material) of the silicon substrate 58 remain on the support 20. In this embodiment, as will be discussed in further detail with respect to FIG. 13, the residual portions 70 of the silicon substrate 58 are removed by a subsequent etching process.

Figure 12:
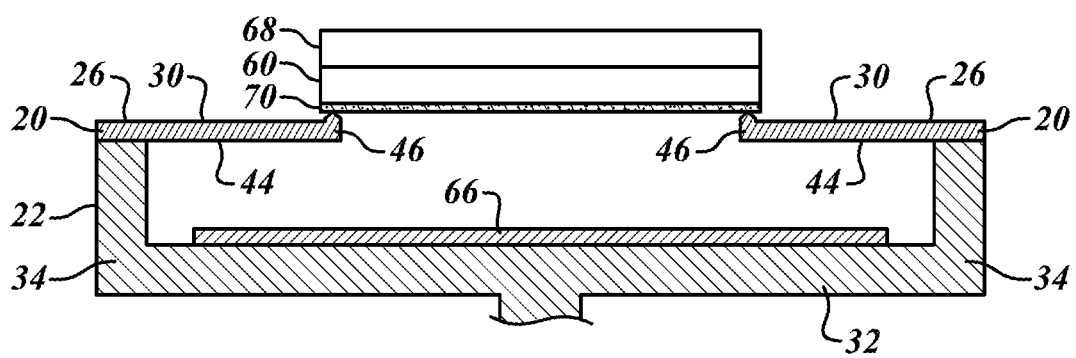

As shown in FIG. 12, a flow of silicon and carbon precursor is introduced into the reaction chamber 24 through the input duct 16. By introducing the silicon and carbon precursor into the reaction chamber 24, the first SiC layer 60 continues to grow in thickness. Stated differently, a second SiC layer 68 begins to grow on the first SiC layer 60. This is often referred to as homo-epitaxial growth. In one embodiment, the flow of silicon and carbon precursor is performed simultaneously with the melting of the silicon substrate 58. In one embodiment, the flow of silicon and carbon precursor is performed after the melting process of the silicon substrate 58 is completed.

When the second SiC layer 68 reaches a desired thickness, the flow of silicon and carbon precursor is stopped. Further, any reaction gases in the reaction chamber 24 are removed from the reaction chamber 24 through the output duct 18.

As previously discussed, in one embodiment, the fourth temperature of the reaction chamber 24 is maintained until all of the silicon substrate 58 is removed from the first SiC layer 60. In this embodiment, after the second SiC layer 68 reaches a desired thickness, the reaction chamber 10 is shut down, vented, and returned to a lower temperature (e.g., room temperature). In one embodiment, the resulting SiC wafer 72 is subsequently immersed in $H_2$ or Ar.

Figure 13:
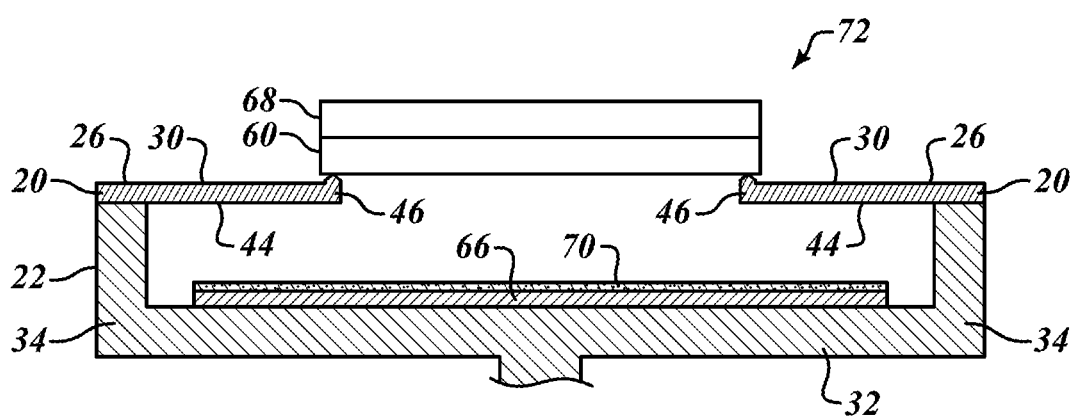

As previously discussed, in one embodiment, the fourth temperature of the reaction chamber 24 is maintained until the silicon substrate 58 is substantially melted and separated from the first SiC layer 60. In this embodiment, after the second SiC layer 68 reaches a desired thickness, the residual portions 70 of the silicon substrate 58 is removed by a subsequent etching process. As shown in FIG. 13, an etching gas, such as hydrochloric (HCl) acid, is introduced into the reaction chamber 24 through the input duct 16. The residual portions 70 of the silicon substrate 58 still coupled to the first SiC layer 60 are then removed by the etching gas. The removed residual portions 70 of the silicon substrate 58 are collected in the receptacle 22. Once the residual portions 70 of the silicon substrate 58 are removed, the reaction chamber 10 is then shut down, vented, and returned to a lower temperature (e.g., room temperature). In one embodiment, the resulting SiC wafer 72 is subsequently immersed in $H_2$ or Ar.

It is noted that it is possible to remove the residual portions 70 of the silicon substrate 58 by a subsequent etching process because the raised portion 46 of the arms 30 lifts or raises the first SiC layer 60, the second SiC layer 68, and the residual portions 70 to be above the body portion 44 and/or the frame 26. By raising the first SiC layer 60, the second SiC layer 68, and the residual portions 70, the etching gas is able to flow to contact the residual portions 70, which are positioned below the first SiC layer 60.

Although the apparatus 10 has been largely discussed with respect to fabricating a SiC wafer, the apparatus 10 may be used for any process in which a first layer of material is melted and separated from a second layer of material.

The various embodiments provide an apparatus and method for fabricating a wafer, such as a SiC wafer. The apparatus includes a support having a plurality of arms for supporting a substrate, such as a silicon substrate. The arms are configured to minimize physical contact between the support and the substrate. As a result, when the substrate is melted, surface tension between the arms and molten material is reduced, and the molten material will be less likely to stick or cling to the support.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
a chamber;
a receptacle in the chamber;
a heater configured to heat the chamber;
an input duct configured to introduce a gas into the chamber;
an output duct configured to remove the gas from the chamber; and
a support in the chamber and on the receptacle,
the support including a frame, an opening in the frame, and a plurality of arms,
each of the plurality of arms having a fixed end and a free end opposite to the fixed end,
the fixed end being attached to the frame,
the free end extending in to the opening and being suspended over the receptacle,
each of the plurality of arms including a body portion and a raised portion,
the body portion having a first end attached to the frame and a second end attached to the raised portion.

2. The apparatus of claim 1 wherein each of the plurality of arms extend from the frame and towards a center of the opening.

3. The apparatus of claim 1 wherein the raised portion includes an upper surface and a plurality of angled side surfaces.

4. The apparatus of claim 1 wherein the frame and the opening have circular shapes.

5. The apparatus of claim 1 wherein the receptacle includes sidewalls, and the support is positioned on the sidewalls.

6. A support, comprising:
a frame;
an opening in the frame; and
a plurality of arms extending in to the opening,
each of the plurality of arms being cantilevered from the frame,
each of the plurality of arms including a body portion coupled to the frame, and a raised portion coupled to the body portion,
an upper surface of the body portion being coplanar with an upper surface of the frame,
the raised portion being positioned at a portion of the arm that is furthest away from the frame.

7. The support of claim 6 wherein the plurality of arms includes a first set of arms having a first length, and a second set of arms having a second length that is larger than the first length.

8. The support of claim 6 wherein the raised portion includes an upper surface and a plurality of angled side surfaces.

9. The support of claim 8 wherein the body portion includes an upper surface and a plurality of angled side surfaces.

10. The support of claim 9 wherein the upper surface of the raised portion is positioned above the upper surface of the body portion.

11. The support of claim 9 wherein the upper surface of the body portion is substantially coplanar with a surface of the frame.

12. A support, comprising:
a frame;
an opening in the frame; and
a plurality of arms physically coupled to the frame,
the plurality of arms extending from the frame and in to the opening,
the plurality of arms including a first set of arms having a first length, and a second set of arms having a second length smaller than the first length,
each of the plurality of arms including a body portion physically coupled to the frame, and a raised portion physically coupled to the body portion,
the frame and the raised portion being on opposite sides of the body portion.

13. The support of claim 12 wherein the raised portion includes an upper surface and a plurality of angled side surfaces.

14. The support of claim 13 wherein the body portion includes an upper surface and a plurality of angled side surfaces.

15. The support of claim 14 wherein the upper surface of the raised portion is positioned above the upper surface of the body portion.

16. The support of claim 12 wherein the plurality of arms extend towards a center of the opening.

17. The support of claim 12 wherein each of the first set of arms is positioned between two arms of the second set of arms.

* * * * *